(12) United States Patent
Johnson

(10) Patent No.: US 6,256,333 B1
(45) Date of Patent: Jul. 3, 2001

(54) VCSEL STRUCTURE INSENSITIVE TO MOBILE HYDROGEN

(75) Inventor: Ralph H. Johnson, Murphy, TX (US)

(73) Assignee: Honeywell Inc., Morristown, NJ (US)

(*) Notice: Subject to any disclaimer, the term of this patent is extended or adjusted under 35 U.S.C. 154(b) by 0 days.

(21) Appl. No.: 08/989,731

(22) Filed: Dec. 12, 1997

(51) Int. Cl.⁷ ....................................................... H01S 3/085
(52) U.S. Cl. ................................. 372/96; 372/45; 372/46
(58) Field of Search .................................. 372/96, 46, 45

(56) References Cited

U.S. PATENT DOCUMENTS

| | | |
|---|---|---|
| 5,513,202 | 4/1996 | Kobayashi et al. |
| 5,547,898 | 8/1996 | Grodzinski et al. |
| 5,557,627 | 9/1996 | Schneider, Jr. et al. |
| 5,893,722 * | 4/1999 | Hibbs-Brenner et al. ............. 372/45 |

OTHER PUBLICATIONS

Yang et al:"Influence of Mirror Reflectivty on Laser Performance of Very–Low Threshold Vertical–Cavity Surface–Emitting Lasers", IEEE Photonics Technology Letters, vol. 7, No. 11, Nov. 1, 1999, pp. 1228–1230.

* cited by examiner

Primary Examiner—James W. Davie
(74) Attorney, Agent, or Firm—John G. Shudy; Andrew A. Abeyta

(57) ABSTRACT

An active region of a VCSEL at one (i.e., n doped) end having an expanded effectively undoped region, and another (i.e., p doped) end having a significantly doped region up to or even including a portion of the active region. A previous way had heavy doping of the n and p doped regions up to the active region, at least close to it or even partially into it.

12 Claims, 7 Drawing Sheets

VCSEL STRUCTURE INSENSITIVE TO MOBILE HYDROGEN

BACKGROUND OF THE INVENTION

The present invention pertains to vertical cavity surface emitting lasers (VCSEL's) and particularly to VCSEL's made by a metal-organic chemical vapor deposition (MOCVD) process.

The perspective view shown in FIG. 1 illustrates a typical structure for a vertical cavity surface emitting laser 10. A gallium arsenide substrate 12 is disposed on an n type electrical contact 14. A first mirror stack 16 and a bottom graded index region or lower spacer 18 are progressively disposed, in layers, on the substrate 12. Region 20 may have one or many quantum wells or may be a bulk active gain region. An active region 20, having one or more quantum wells, is formed and a top graded index region or upper spacer 22 is disposed over active region 20. The spacers are to provide the appropriate critical distance between the mirrors to provide the proper-sized resonant cavity for a given wavelength and the distance is related to that wavelength or a multiple thereof. Active region 20 has a gain that compensates for the leaking out of photons. Photons bounce back and forth and, due to imperfect mirrors 16 and 24, eventually leak out of the device. Greater photon loss means more gain is needed.

A p type top mirror stack 24 is formed over active region 20 and a metal layer 26 forms an electrical contact. Current 21 can be caused to flow from the upper contact 26 to the lower contact 14. This current 21 passes through the active region 20. Upward arrows in FIG. 1 illustrate the passage of light 23 through an aperture or hole 30 in the upper metal contact 26. Downward arrows illustrate the passage of current 21 downward from the upper contact 26 through p type GaAs cap layer 8, p type conduction layer 9, p type upper mirror stack 24 and active region 20. A hydrogen ion bombardment or implantation 40 forms an annular region of electrically resistant material. In order to confine the current flow 21 through active region 20, device 10 uses a hydrogen ion implant technique to create electrically insulative regions around an electrically conductive opening extending therethrough. A central opening 42 of electrically conductive material remains undamaged during the ion implantation process. As a result, current 21 passing from upper contact 26 to lower contact 14 is caused or forced to flow through electrically conductive opening 42 and is thereby selectively directed or confined to pass through a preselected portion of active region 20.

The present problem concerns active region 20 of the device. The issue relates to the reliability implications that result from the interaction between carbon and hydrogen in the VCSEL structure. There have been vertical cavity surface emitting lasers that have had short term degradation caused by hydrogen passivation or compensation of carbon. Hydrogen compensates carbon acceptors in AlGaAs. This phenomenon is a byproduct of the MOCVD growth process and also results from proton implantation. Carbon ions are used in doping. Carbon doping brings in a significant amount of hydrogen. The results of hydrogen passivation are rapid degradation of the devices sometimes followed by rapid improvement, which is the result of the hydrogen moving through the structure under bias. Longer baking during the fabrication process drives out more hydrogen.

There are several kinds of doped structures. If low doping $\leq 5 \times 10^{17}/cm^3$ (5e17) (curve 13 in FIG. 2a) is used in p-spacer 22 of FIGS. 1 and 3, then the structure is sensitive to mobile hydrogen. The sensitivity to mobile hydrogen occurs because hydrogen acts as a donor and compensates the carbon. However, the hydrogen is very mobile and under field-aided diffusion, hydrogen H drifts towards active region 20 and compensates carbon C acceptors on the edge of active region 20 in FIG. 2a. One way to overcome this compensation is to use higher p doping near active region 20 (see curve 15 in FIG. 2a). The problem that arises with such doping is that there remains a large slope 19 in active region 20 even at lasing voltages in FIG. 2c. The separation of the carriers resulting from energy bank slope versus position 19 makes the recombination inefficient. To overcome this problem, a thick (15 nanometers) effectively undoped region is placed on lower side 18 of active region 20. The voltage is then allowed to drop across the undoped region.

The post growth anneal and the use of low arsine over pressures during growth have been other solutions attempted to prevent hydrogen passivation or compensation of carbon that causes at least short term degradation of VCSEL's. The present invention is a structural solution to the problem.

SUMMARY OF THE INVENTION

A structural way to make the VCSEL structure 10 less sensitive to the hydrogen passivation problem is to use heavily doped layers near active region 20 (of FIGS. 1 and 3). These layers would be too heavily doped for the hydrogen to completely compensate. If this doping is not carefully performed, device 10 will not work because energy band structure 17 of active region 20 will have a residual tilt 19 even at lasing voltages (as shown in FIG. 2c). This represents an electric field across active region 20. The electric field causes the carriers of the opposite charge to preferentially seek one side or the other of active region 20 and radiative recombination becomes inefficient. Since radiative recombination is inefficient, parasitic recombination mechanisms dominate.

To eliminate this residual tilt of bands 17, an effectively undoped section 18 in the n graded region (or close to active region 20 on the n-side which may include an n spacer) must be present and this undoped region 18 must be of sufficient extent. The term "effectively undoped" means that there are residual impurities in any material and that there is in reality no such thing as strictly undoped material. For purposes in this description and the claims, "unintentionally doped," "effectively undoped" and "undoped" mean the same thing and may be used here interchangeably. Additionally, p doping can be added to active region 20. Two dissimilar materials (i.e., n and p doped), when placed together, have different work functions and charges that flow from one to another. So before a bias voltage for lasing is applied, there is a built-in voltage between the p and n regions. This voltage causes an electric field/energy band slope which is reduced by reducing the charge at the junction. This is accomplished by introducing an undoped (uncharged) region. As voltage is applied the band flattens further and the electric field is reduced.

In summary, the invention has two features. It provides for relatively high doping in the p regions 22 down to and optionally through active region 20, and it has a thick undoped region in the lower graded region 18. The high p-doping in spacer 22 makes the structure insensitive to hydrogen, and the thick lower undoped region 18 allows the electric field to drop across this region making the active region energy wells relatively flat at lasing voltages (in FIG. 4c). An alternate structure may be that in the above, the p doping and regions be interchanged with the n doping and regions.

In essence, to eliminate sensitivity to mobile hydrogen, a heavily doped region (i.e., in the upper spacer) needs to be placed adjacent to the active region. To reduce the tilt of the energy bands in the active region (under active lasing bias voltage across the VCSEL) resulting from the heavily doped region adjacent to the active region, an undoped or unintentionally doped region (i.e., in the lower spacer) of sufficient extent is placed on the other end of the active region.

DESCRIPTION OF THE SPECIFIC EMBODIMENT

Figure 4:
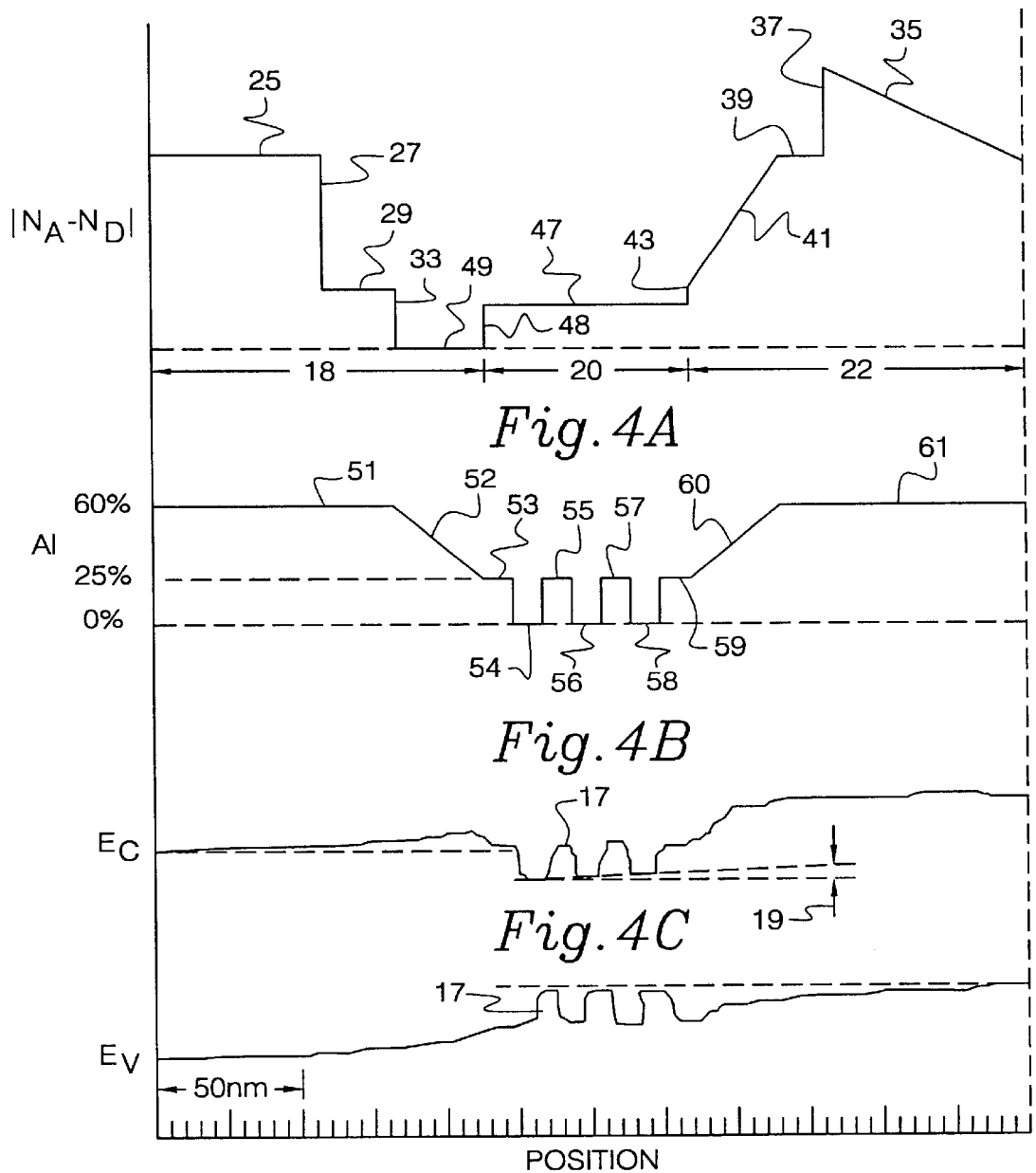
FIGS. 4a, 4b and 4c reveal the doping scheme, the aluminum content, and energy band structure of the invention.

The invention, as illustrated in FIGS. 4a, 4b and 4c, provides for moderate to heavy doping having a peak greater than $1 \times 10^{18}/cm^3$ (i.e., 3e18) in the upper p layers 22 adjacent to active region 20, that is, p doping near active region 20; and a very lightly doped or undoped (unintentionally doped, i.e., <7e17) region 49 below active region 20, that is, the n portion of the junction adjacent to active region 20 of at least 8 nanometers (nm) or even greater than a 10 nm extension into spacer region 18 (FIG. 4a). These levels of doping apply to VCSEL's having greater than a 50 percent aluminum composition in the spacer regions 18 and 22. Otherwise, the 10 nm extension would be less. It is also beneficial to increase the hole barrier with high doping (i.e., >1e18) in the n portion more than 10 nm away from active region 20 (FIG. 4b). The latter is a subsidiary feature.

The doping in active region 20 must also be either undoped or p doped, but it cannot be n doped. The p doped region can extend down into the aluminum graded region or lower spacer 18. If this extension into the aluminum graded region or lower spacer 18 is taken too much to an extreme, then a loss in injection efficiency occurs. Despite this extension of the p region, there needs to be at least an 8 nm region of undoped or lightly doped material below the last p layer before significant n doping begins.

The preferred structure is one that has a flat active energy band region at lasing voltages, as shown in FIG. 4c, which has large minority carrier barriers at the edges of active region 20, and has high doping close to the active region at least in the p region and optionally at lower doping levels through a portion of region 20 and even into spacer 18, as indicated in FIG. 4a.

In more detail, the doping structure of VCSEL 10, as shown in FIG. 4a, has an n doped substrate 12 formed on contact 14. A first n doped multilayer mirror 16 is formed on substrate 12. On mirror 16 is a spacer 18 as needed for forming the appropriate resonant cavity between the first and second mirrors. Spacer 18 is n doped, preferably at 2e18 nearly up to active region 20, as shown by curve 25. The n doping level drops from 2e18, as indicated by line 27, to 5e17 as indicated by line 29. The latter n doping level extends through spacer 18 (or mirror 16 if there is no spacer) up to active region 20, where it ends as line 33 indicates. The length of doping level 5e17 line 29 represents typically 10 to 15 nm. It must not need go all the way to region 20.

Formed on spacer 18 is active region 20 layers, and on region 20 is spacer 22 or mirror 24, depending upon the need or not of spacer 22. The p doping level may start out between 1e18 and 3e18, and increase to a peak of 3e18 at a distance of about 20 to 40 nm from active region 20, as shown by line 35. Then the p doping level drops, as indicated by line 37, to 2e18 as shown by line 39. The distance represented by line 39 is typically between 10 and 15 nm. Then the doping level drops in a gradual fashion from 2e18 to 1e18 (which is the redesign) over a distance between 10 and 15 nm up to active region 20, as illustrated by line 41. At the place where spacer 22 is adjacent to region 20, the p dopant level drops to 3e17 as indicated by line 43. The p dopant extends into active region 20 at a level of 3e17 to spacer 18, as indicated by lines 47 and 48. The p doping of region 20 is optional. Line 49 is the undoped or unintentionally doped level.

FIG. 4b shows the percentage of aluminum content in 18 and 22, and the layers of active region 20. Spacer 18 has about a 60 percent content of aluminum as indicated by line 51. Sixty percent aluminum means $Al_{0.6}Ga_{0.4}As$. In the top 15 or so nm of spacer region 18, the aluminum content gradually decreases from 60 percent to about 25 percent, as indicated by line 52. The gradual decreasing of the aluminum content from 60 percent, as represented by line 52, may start in spacer 18 well before entry into region 20.

At the 25 percent level of aluminum, this content percentage may remain constant for at least one layer of active region 20, as shown by line 53. The next layer of active region 20 may have about zero percentage content of aluminum, as indicated by line 54. The next layer has about 25 percent aluminum content as noted by line 55; the following layer has about zero percent aluminum as shown by line 56; and the next layer has about 25 percent aluminum as noted by line 57, the subsequent layer has zero percent aluminum as indicated by line 58, and the remaining layer at the top of region 20 has 25 percent of aluminum as shown by line 59. There could be more or less alternating layers with and without, respectively, aluminum, depending how many quantum wells are desired in region 20. Of the alternating layers having aluminum content, one may have between twenty and thirty percent and the other between zero and five percent of aluminum. Following this layer is spacer 22 wherein the aluminum content gradually increases from 25 percent to 60 percent for the 15 or so nm into spacer 22, as illustrated by line 60. Line 61 represents the 60 percent content of aluminum in the remaining portion of spacer 22.

Figure 1:
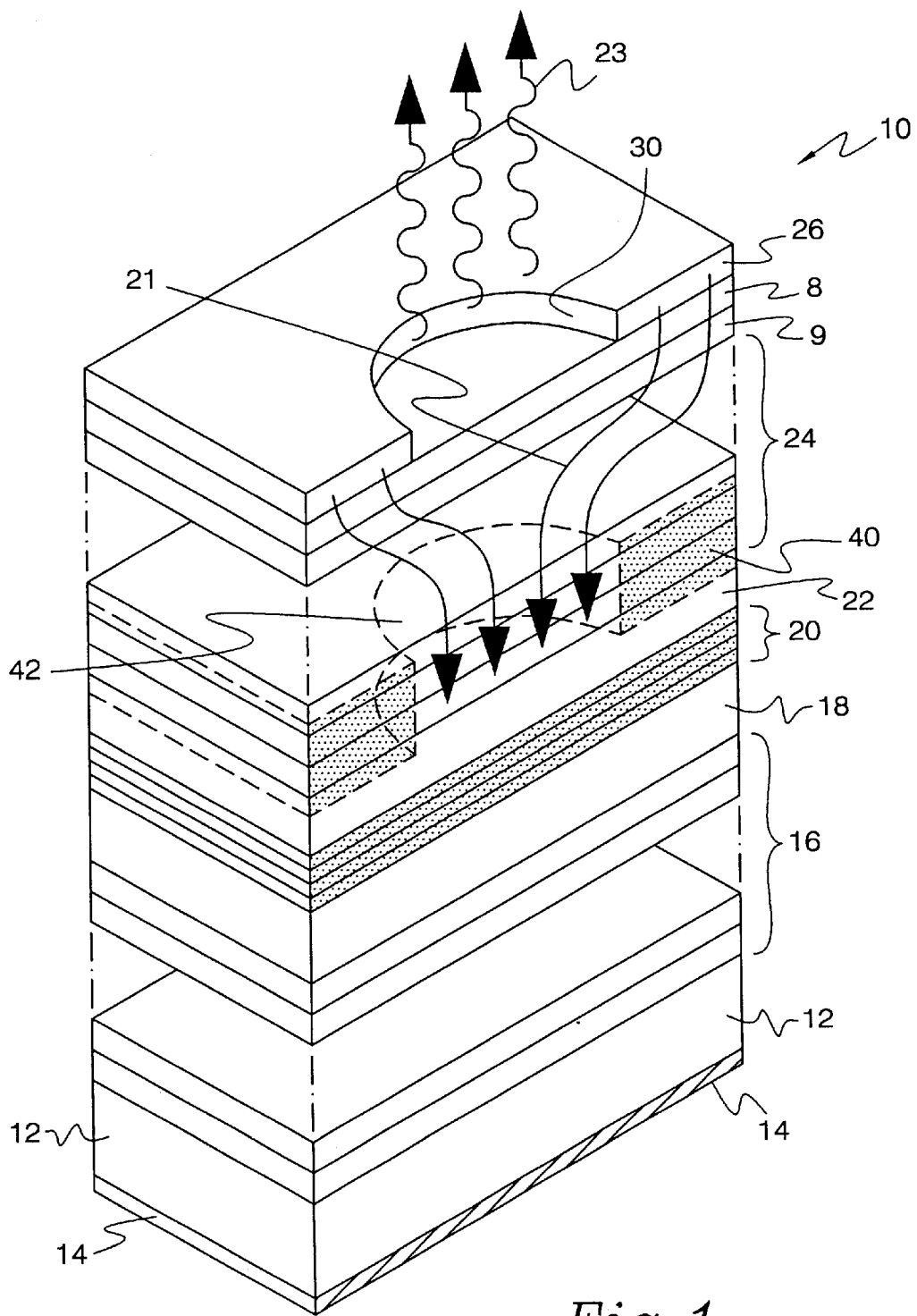
FIG. 1 is an illustrative example of a vertical cavity surface emitting laser.
Figure 2:
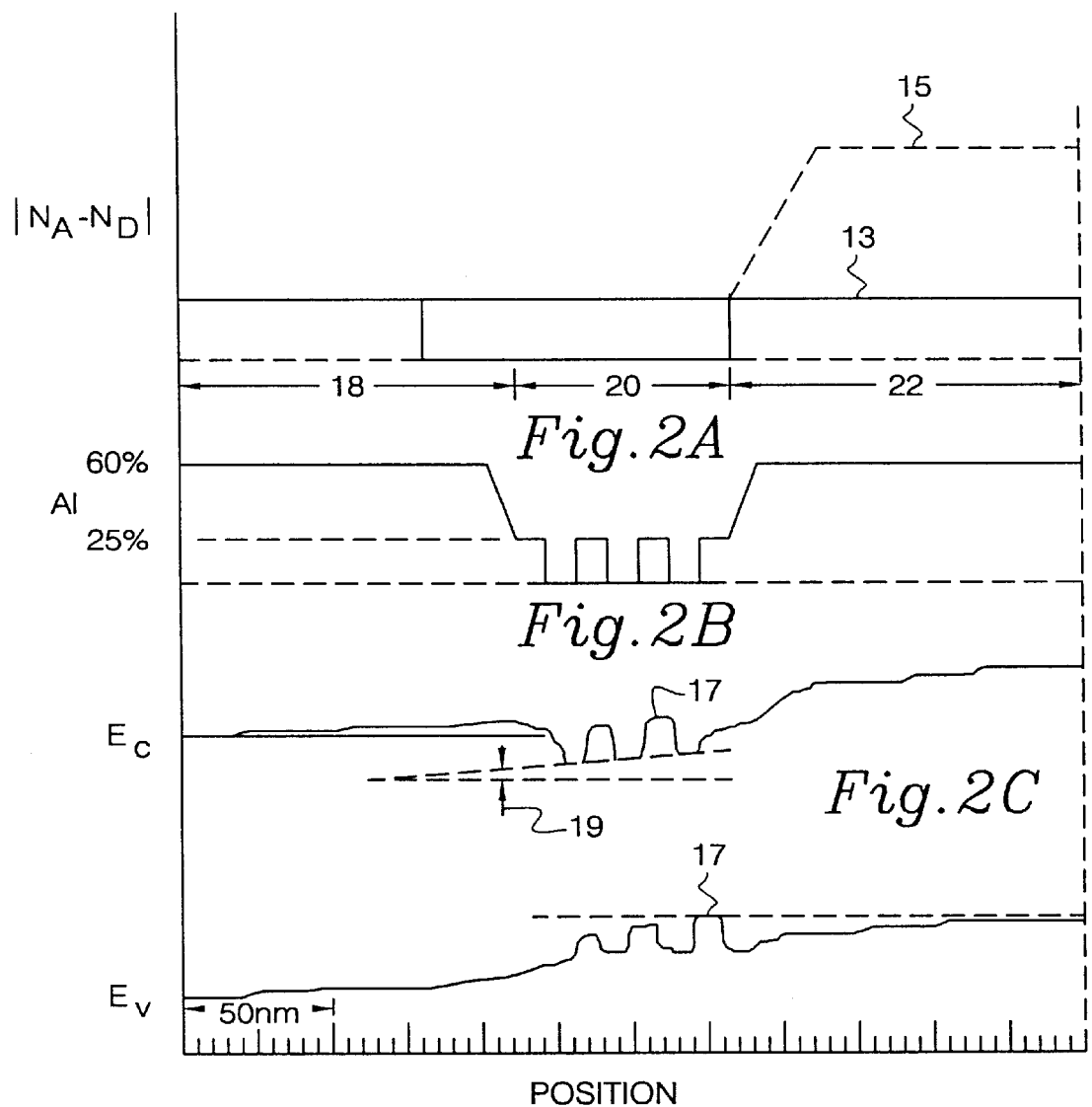
FIGS. 2a, 2b and 2c show a typical doping scheme around the active region which is sensitive to mobile hydrogen, an aluminum content profile and resultant energies.
Figure 3:
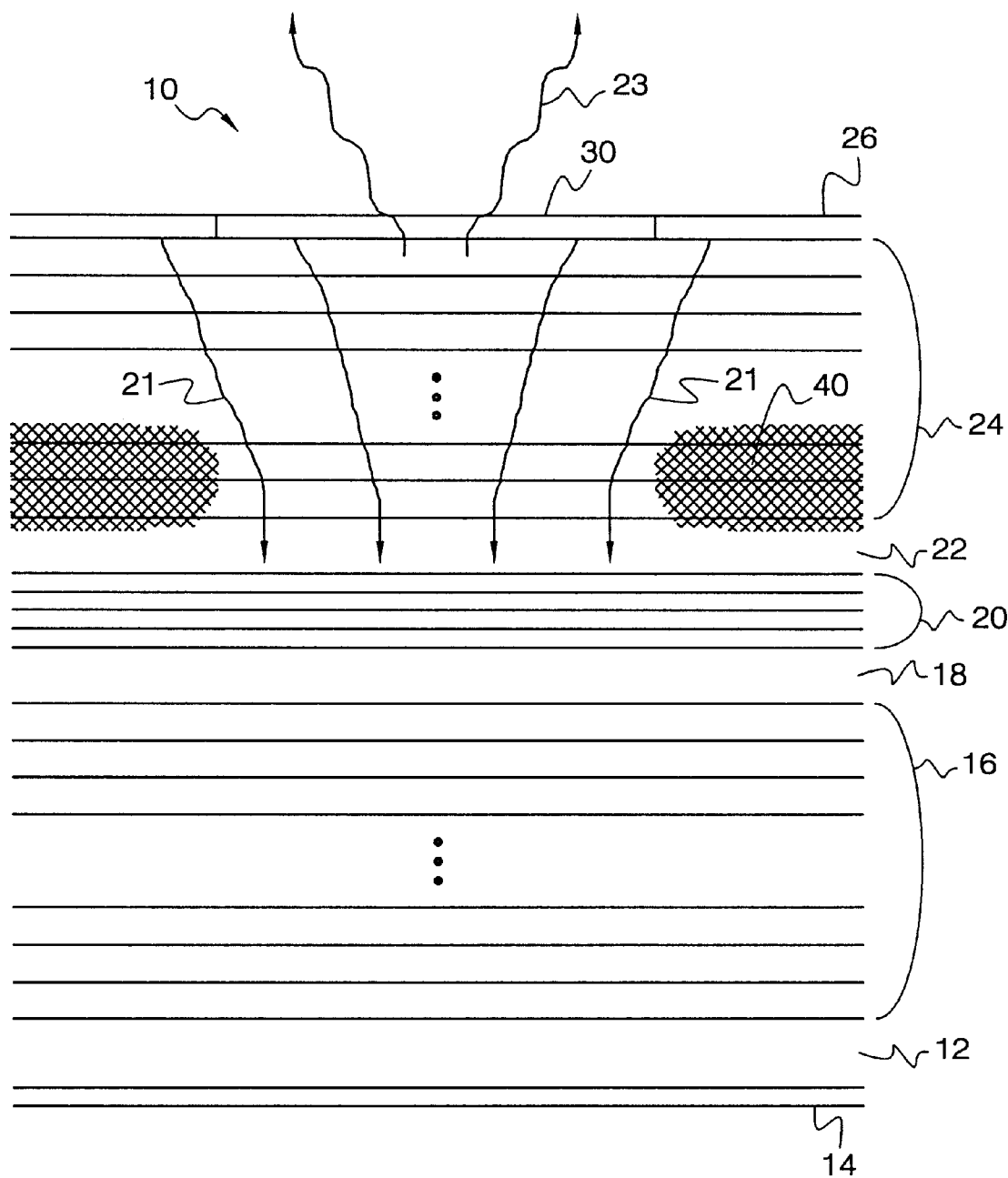
FIG. 3 is a cutaway of the various layers and the current confining implant.

FIG. 4c shows the performance aspects of the preferred structure having an applied voltage of 1.5 volts across active region 20 of a device 10 for emitting light at 850 nm. The relative tilt 19 to the active region is not large and the barriers to minority carriers are large. FIG. 4a reveals the structure having heavy doping close to active region 20. FIG. 2c illustrates an active region 20 which has moderate doping in the carbon-doped spacer layer 22, and does not have a sufficiently low-doped region 20, thus resulting in a large tilt 19 in active region 20 at the lasing voltage of 1.5 volts. This large tilt 19 represents an electric field which causes a separation of the carriers in active region 20 and causes the radiative recombination of the carriers to be reduced relative to parasitic currents. Also, the doping in the spacer 18 is light so there is susceptibility to hydrogen compensation.

Figure 5:
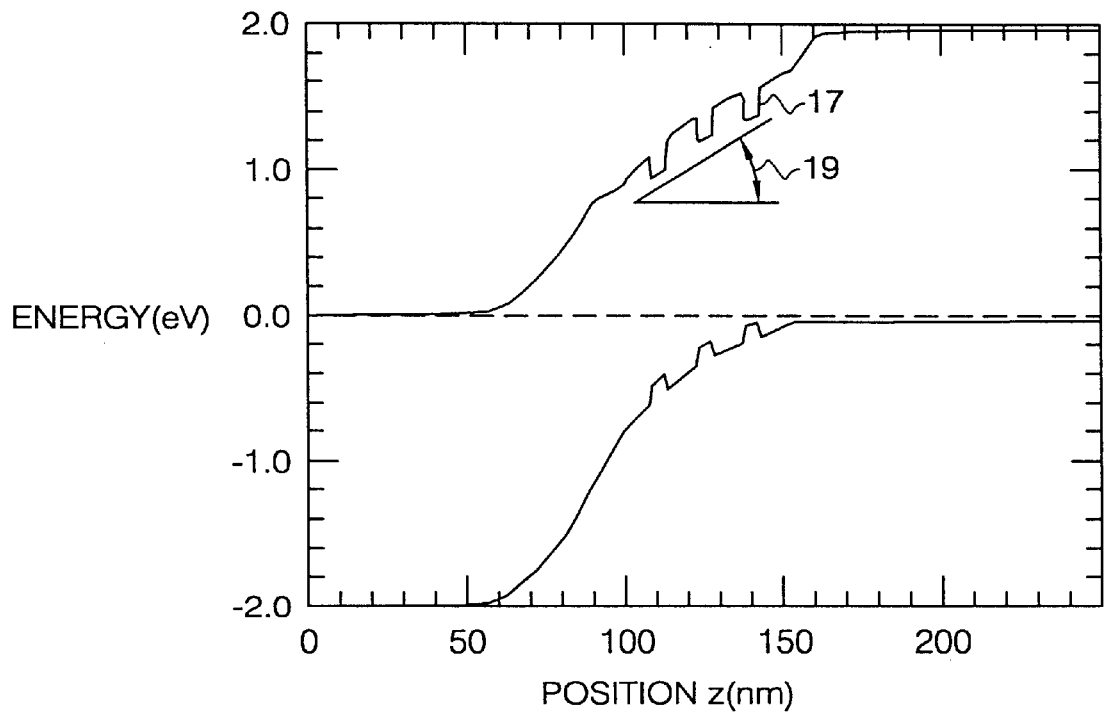
FIGS. 5, 6 and 7 show the energy band structures for various voltages, respectively, of a certain doping scheme.
Figure 6:
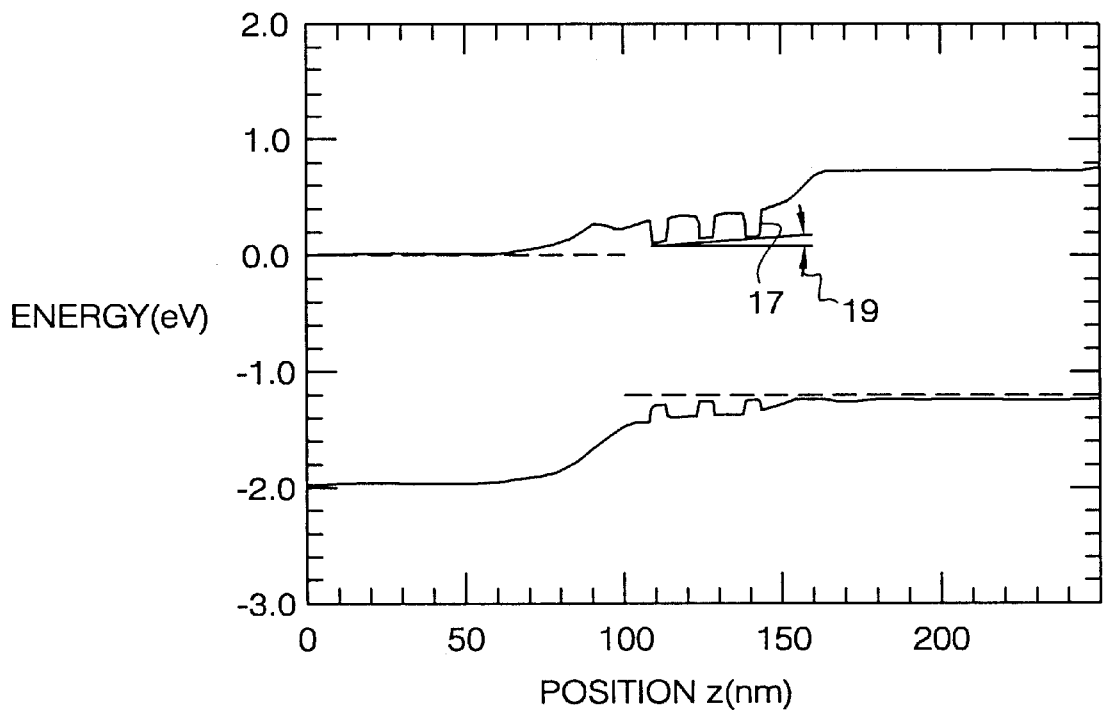
Figure 7:
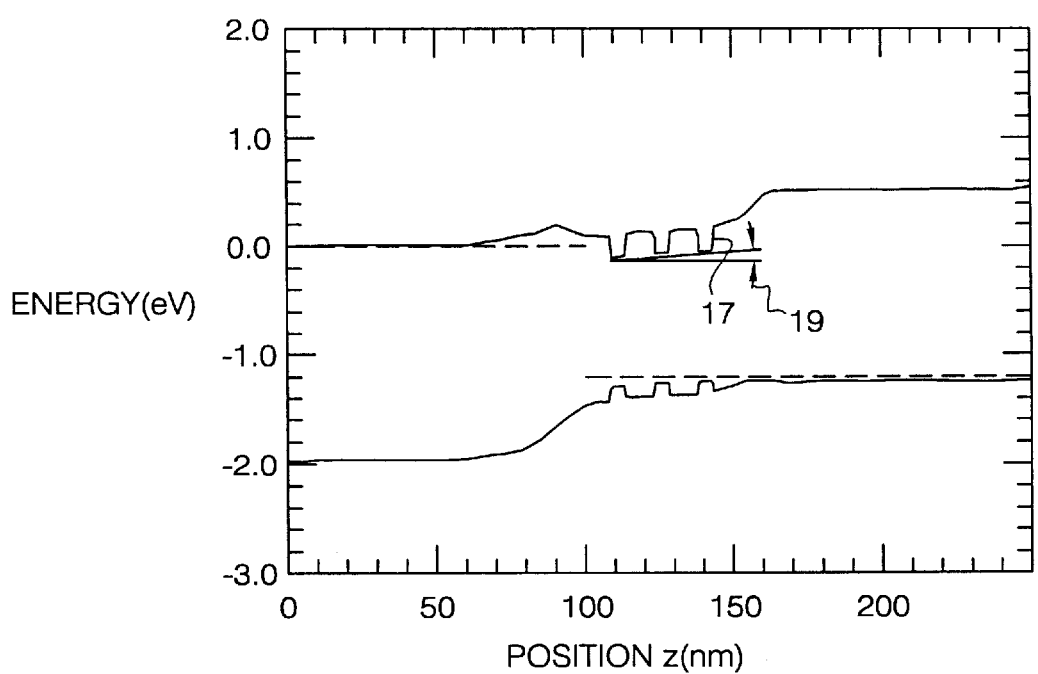

One may note the changes at increasing bias voltages from zero to 1.5 volts, as shown in FIGS. 5, 6 and 7. Note that at low voltages, no lasing occurs. These are for having an active region doped at 5e17 and the upper spacer at 2e18. At zero volts, the active region has a large slope across it (FIG. 5). At 1.2 volts, the active region flattens out significantly (FIG. 6). And at 1.5 volts, the active region is significantly flat (FIG. 7). Doping in active region 20 flattens the energy bands 17 at lower bias voltages more so than with no doping. Conductivity modulation increases conductivity in active region 20. Conductivity modulation in active region 20 is sufficiently high that when 1.5 volts (lasing voltage) is reached, the active region energy bands become flat. For the same structure of FIGS. 5, 6 and 7, except the former having an undoped active region; at zero voltage, the slope is steep; at 1.2 volts, the undoped approach still shows a significant slope remaining in the active region; and at 1.5 volts, the conductivity modulation nearly flattens the slope in the active region. If there was not the wide undoped lower graded region, then a large slope would remain as in FIG. 2c.

An additional approach that minimizes the problem of hydrogen passivation or compensation of carbon, is an annealing of material after growth in a non-atomic hydrogen producing environment. The hydrogen gradually diffuses out and the problem is reduced. A combination of the annealing and the above-noted structure of the present invention is better than either one alone.

Figure 8:
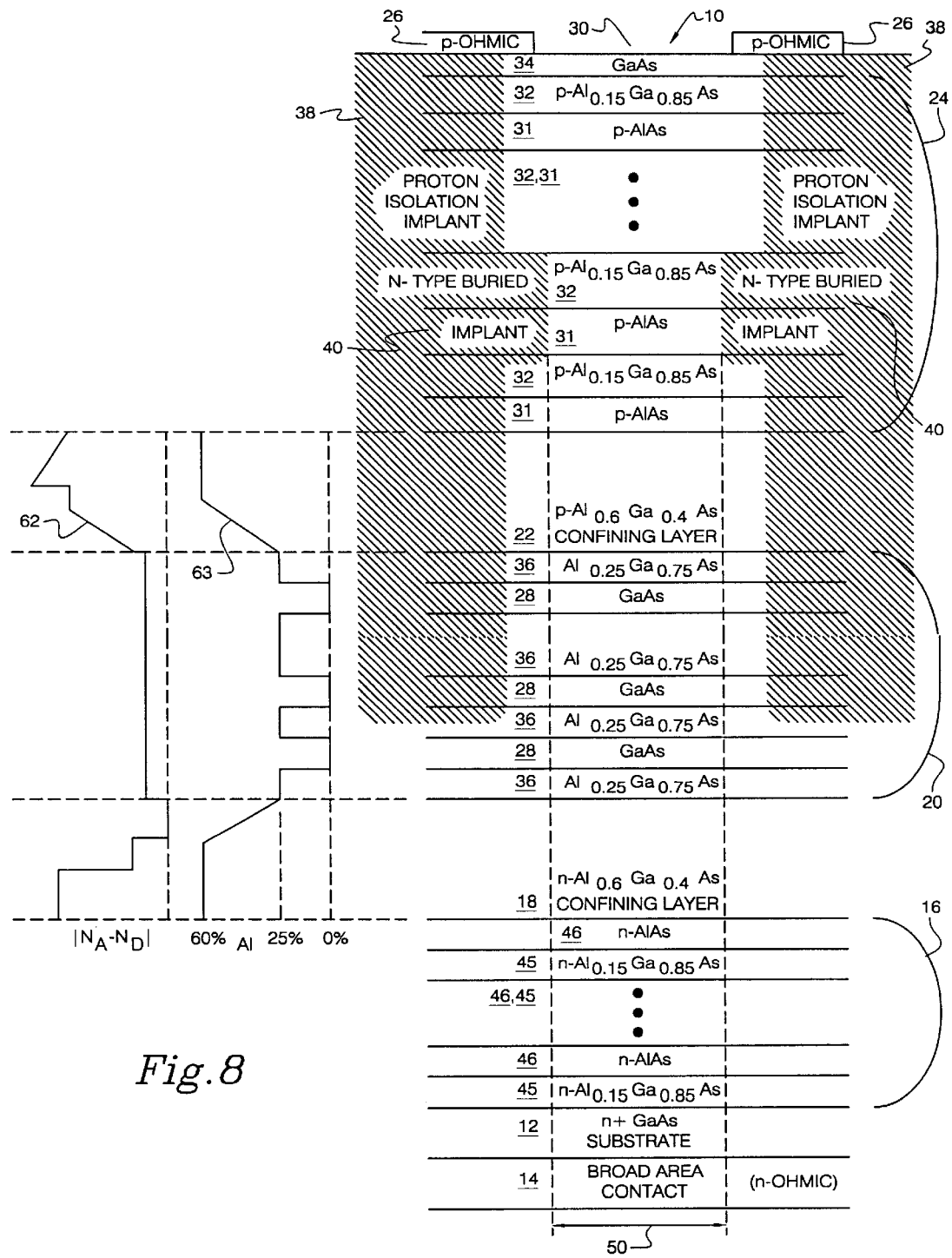
FIG. 8 reveals the material composition of an example VCSEL.

FIG. 8 illustrates the composition of an example of structure 10. In this version, alternating epitaxial layers 45 and 46 for laser 10 are deposited on a substrate 12 which is doped n-type. On the bottom side of substrate 12 is formed a broad area contact 14 (i.e., n-ohmic). A bottom mirror 16, consisting of 26 periods of alternating layers of AlAs 46 and $Al_xGa_{(1-x)}As$ (x=0.15 is preferred, but x may have any value greater than 0.00) 45, all doped n-type, are grown to form a highly reflecting mirror 16. The total number of mirror periods may be greater or less than 26, depending on other parameters. Dopant 40 is implanted or diffused as an n-type or electrically insulating dopant in layers 31 and 32 of mirror 24, preferably several layers above confining layer 18, to function in blocking current flow from the perimeter of active region 20 and lower mirror 16, and to confine the current flow within dimension 50. It is preferable for the depth of implant 40 to be several tenths of a micron but may range between 0.1 and 2 microns. Dimension 50 may be between 0.1 and 60 microns, but is typically several microns, i.e., 2 to 5 microns. Several more mirror periods (0 to 10) may be formed on top of the implanted or diffused surface followed by the mid-portion of structure 10, which consists of two $Al_xGa_{(1-x)}As$ (x=0.6) confining layers 18 and 22. The proportion indicated by x may be 0.25 or greater. There is p type doping in the layer nearest the p type mirror. Layers 18 and 22 sandwich a region 20 having three GaAs quantum wells 28, separated from one another and confining layers 18 and 22 by four $Al_xGa_{(1-x)}As$ (x=0.25) barrier layers 36. The number of GaAs quantum wells may be from one to five. Alternatively, one could potentially have an active region 20 without quantum wells, e.g., a region having an emitting layer of about 0.2 micron thick. On top of confining layer 22 on active region 20, a p-type mirror 24 is grown, consisting of 18 periods of alternating layers of p-AlAs 31 and p-$Al_xGa_{(1-x)}As$ 32 (x=0.15 preferably, but may have any value greater than 0.05). The number of periods may be greater or less than 18, depending on other parameters. A GaAs contact layer 34 is formed on top of mirror 24. A proton isolation implant 38 is placed at the perimeter of contact layer 34, mirror 24, active region 20 and confining layer 22, to separate one device 10 from a like neighboring device on a chip. If a single laser chip 10 were to be made, then it is possible that one could eliminate this proton implant 38, if the implant or diffusion made on top of the n-mirror were to extend all the way to the edge of the chip. Laser 10 connections are formed by depositing at least one p-type ohmic metal contact 26 on the top surface of contact layer 34, and a broad area n-type ohmic contact 14 on the back side of wafer substrate 12. The resulting device 10 emits laser light in the range of 760 to 870 nm.

Curves 62 and 63 of FIG. 8 reveal the concentration of dopant and Al content, respectively, in regions 18, 20 and 22.

What is claimed is:

1. A VCSEL structure comprising:

first mirror;

second mirror;

an active gain region situated between said first and second mirrors;

first spacer situated between said first mirror and said active gain region; and second spacer situated between said second mirror and said active gain region; and wherein a first portion of said first spacer adjacent to said active gain region is substantially undoped, and a first portion of said second spacer adjacent to said active gain region is moderately doped;

wherein said second spacer comprises a dopant of a first type;

wherein said first mirror comprises a dopant of a second type and said second mirror comprises a dopant of the first type;

wherein "moderately doped" means a doping level greater than 3e17;

wherein said first spacer has a composition of greater than 20 percent aluminum and said second spacer has a composition of greater than 20 percent aluminum;

wherein said active gain region has a set of alternating layers wherein every other layer has a composition of at least 15 percent aluminum and a layer between the every other layer has a composition of about zero percent aluminum; and wherein:

the dopant level of the first portion of said first spacer, adjacent to said gain region, is less than 3e17; and the dopant level of the first portion of said second spacer, adjacent to said active gain region, is about 1e18.

2. The VCSEL structure of claim 1 wherein the dopant level in a second portion of said second spacer, adjacent to the first portion of said second spacer, gradually increases proportional to distance from the first portion of said second spacer, to a level of at least 1e18.

3. The VCSEL structure of claim 1 wherein said first spacer is substantially undoped.

4. A VCSEL structure insensitive to mobile hydrogen, comprising:

a first reflector adjacent to a substrate;

a first spacer adjacent to said first reflector;

an active region adjacent to said first spacer;

a second spacer adjacent to said active region; and a second reflector adjacent to said second spacer; and
wherein:
said first spacer is n doped at a level between $5\times10^{17}/cm^3$ (5e17) and $2\times10^{18}/cm^3$ (2e18); and
said second spacer is p doped at a level between 5e17 and 3e19.

5. The VCSEL structure of claim 4, wherein:
said first spacer has a composition greater than 60 percent aluminum;
said second spacer has a composition of about 60 percent aluminum; and
said active region has alternating layers with compositions of about 25 percent and zero percent aluminum, respectively.

6. The VCSEL structure of claim 5, wherein a portion of said active region nearest said second spacer is p doped at a level less than 3e17.

7. The VCSEL structure of claim 6, wherein a portion of said active region nearest said second spacer is substantially undoped.

8. A VCSEL structure insensitive to mobile hydrogen, comprising:
a first mirror situated on a substrate;
a first spacer layer situated on said first mirror;
an active region situated on said first spacer layer;
a second spacer layer situated on said active region; and
a second mirror situated on said second spacer layer; and
wherein:
said first spacer layer is n doped at a level between $5\times10^{17}/cm^3$ (5e17) and $2\times10^{18}/cm^3$ (2e18);
said second spacer layer is p doped at a level between 5e17 and 3e19;
said first spacer layer has a composition of greater than 50 percent aluminum;
said second spacer layer has a composition of greater than 50 percent aluminum; and
said active region has alternating layers with compositions of greater than 20 percent and less than 5 percent aluminum, respectively.

9. The VCSEL structure of claim 8, wherein a portion of said active region nearest said second spacer layer is p doped at a level of 3e17.

10. The VCSEL structure of claim 8, wherein a portion of said active region nearest said first spacer layer is substantially undoped.

11. A VCSEL structure comprising:
first mirror;
second mirror;
an active gain region situated between said first and second mirrors;
first spacer situated between said first mirror and said active gain region; and
second spacer situated between said second mirror and said active gain region; and
wherein a first portion of said first spacer adjacent to said active gain region is substantially undoped, and a first portion of said second spacer adjacent to said active gain region is moderately doped;
wherein said second spacer comprises a dopant of a first type;
wherein said first mirror comprises a dopant of a second type and said second mirror comprises a dopant of the first type;
wherein "moderately doped" means a doping level greater than 6e17;
wherein said first spacer has a composition of greater than 20 percent aluminum and said second spacer has a composition of greater than 20 percent aluminum;
wherein said active gain region has a set of alternating layers wherein every other layer has a composition of at least 15 percent aluminum and a layer between the every other layer has a composition of about zero percent aluminum; and
wherein the dopant level of the first portion of said first spacer, adjacent to said gain region, is less than 3e17, and the dopant level of the first portion of said second spacer, adjacent to said active gain region, is about 1e18.

12. A VCSEL structure comprising:
first mirror;
second mirror;
an active gain region situated between said first and second mirrors;
first spacer situated between said first mirror and said active gain region; and
second spacer situated between said second mirror and said active gain region; and
wherein a first portion of said first spacer adjacent to said active gain region is substantially undoped, and a first portion of said second spacer adjacent to said active gain region is moderately doped;
wherein said second spacer comprises a dopant of a first type;
wherein said first mirror comprises a dopant of a second type and said second mirror comprises a dopant of the first type;
wherein "moderately doped" means a doping level greater than 1e18;
wherein said first spacer has a composition of greater than 20 percent aluminum and said second spacer has a composition of greater than 20 percent aluminum;
wherein said active gain region has a set of alternating layers wherein every other layer has a composition of at least 15 percent aluminum and a layer between the every other layer has a composition of about zero percent aluminum; and
wherein the dopant level of the first portion of said first spacer, adjacent to said gain region, is less than 3e17, and the dopant level of the first portion of said second spacer, adjacent to said active gain region, is about 1e18.

* * * * *